(12) United States Patent
Hong et al.

(10) Patent No.: US 6,689,701 B1
(45) Date of Patent: Feb. 10, 2004

(54) METHOD OF FORMING A SPIN ON GLASS FILM OF A SEMICONDUCTOR DEVICE

(75) Inventors: Sang Ki Hong, Ichon (KR); Sang Ho Jeon, Ichon (KR); Hyug Jin Kwon, Seoul (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 08/997,911

(22) Filed: Dec. 24, 1997

(30) Foreign Application Priority Data

Dec. 28, 1996 (KR) .............................. 96-74981

(51) Int. Cl.⁷ ..................... H01L 21/31; H01L 21/469; H01L 21/56

(52) U.S. Cl. .................. 438/782; 438/762; 438/788

(58) Field of Search ................. 438/782, 761, 438/762, 788, 787

(56) References Cited

U.S. PATENT DOCUMENTS

| 4,222,792 | A | | 9/1980 | Lever et al. ............... 148/1.5 |
| 5,192,697 | A | | 3/1993 | Leong |
| 5,376,586 | A | | 12/1994 | Beilin et al. .............. 437/195 |
| 5,759,906 | A | * | 6/1998 | Lou |
| 6,132,814 | A | * | 10/2000 | Livesay et al. ............ 438/787 |

FOREIGN PATENT DOCUMENTS

| JP | 63-261856 | | 10/1988 | .......... H01L/21/90 |
| JP | 01-102942 | | 4/1989 | .......... H01L/21/95 |
| JP | 02-152258 | | 6/1990 | .......... H01L/21/90 |
| WO | WO 96/36070 | * | 11/1996 | |
| WO | 97/00535 | | 1/1997 | |
| WO | 97/01864 | | 1/1997 | |

* cited by examiner

*Primary Examiner*—John F. Niebling
*Assistant Examiner*—Ron Pompey
(74) *Attorney, Agent, or Firm*—Jacobson Holman PLLC

(57) ABSTRACT

The present invention discloses a method of forming a spin on glass film which can prevent a shift of the threshold voltage of a device by curing the spin on glass film with an electron beam of energy of 6–7 kV.

2 Claims, 2 Drawing Sheets

In case of using a furnace
for curing a SOG film

In case of using an electron
beam having energy of 5kV

In case of using an electron
beam having energy of 6kV

METHOD OF FORMING A SPIN ON GLASS FILM OF A SEMICONDUCTOR DEVICE

BACKGROUND OF THE INVENTION

1. Field of the Invention

This invention relates to a method of forming a spin on glass film of a semiconductor device.

2. Brief Description of Prior Arts

Generally, a spin on glass film (below, called as "SOG" film) is widely used as a planarizing film of metal layers in semiconductor device and formed through a coating process and a curing process. In method of curing the SOG film, there are methods using a furnace and an electron beam.

In the method of curing the SOG film using an electron beam, electron is accelerated by high energy and then implanted into the SOG film. Thus, the SOG film is cured by a collision energy and heat generated by collision between electrons and SOG atoms. Therefore, as compared with the method using the furnace, moisture contained in the SOG film is removed completely and the SOG film has a dense structure. However, a disadvantage of the curing process using an electron beam is that the characteristic of device may be unstable by a shift of threshold voltage.

SUMMARY OF THE INVENTION

Therefore, the object of this invention is to provide a method of forming a SOG film which can prevent a shift of the threshold voltage of a device.

To achieve this object, a coated spin on glass is cured by an electron beam with a low energy, the energy of electron beam is between 5 and 7 kV. Also, a does of said electron is 3000 uC/cm² or more.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE DRAWINGS

Figure 1:
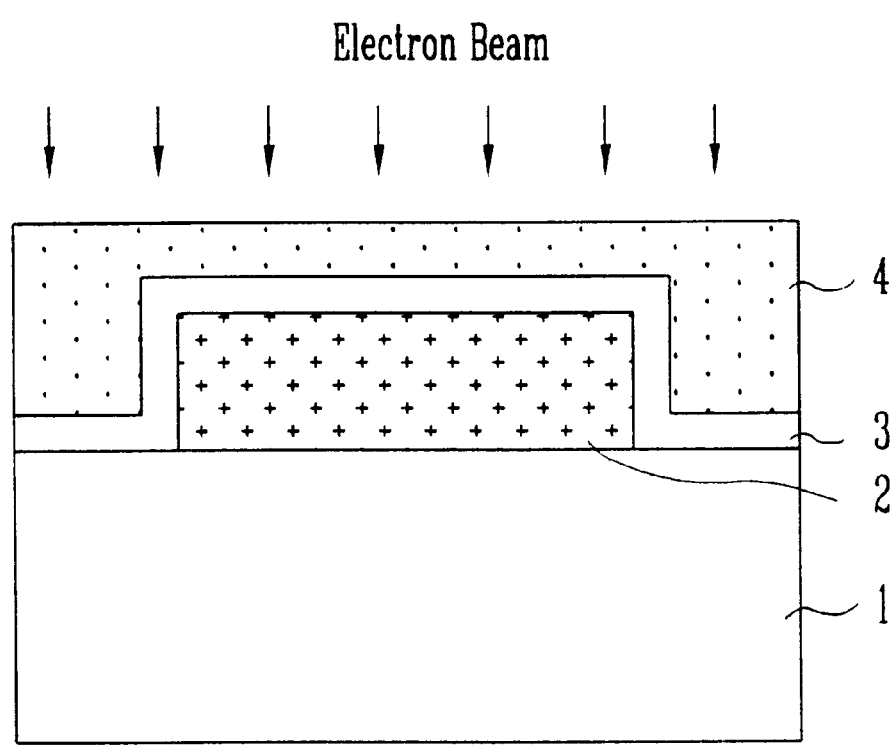
FIG. 1 is a sectional view to explain a method of forming a SOG film of a semiconductor device according to the present invention.

As shown in FIG. 1, an oxide film 3 and a SOG film 4 are sequentially formed on a silicon substrate 1 on which a metal wire 2 is formed. Then, the SOG film 4 is cured. At this time, a curing process is performed by an electron beam with an energy of between 5 and 7KV and the does of electron of 3000 uC/cm² or more. The shift of threshold voltage can be prevented by adjusting the energy of between 5 and 7 KV, and the sufficient electrons are implanted into the SOG film 4 by controlling the does of electron of 3000 uC/cm² or more so that the SOG film 4 has more dense structure.

TABLE

| Energy (kV) | Ratio of shift of threshold voltage |
|---|---|
| 5 | 3.9% |
| 6 | 4.3% |
| 7 | 4.7% |
| 8 | 9.3% |
| 10 | 14.0% |
| 15 | 15.5% |

The above table is the experimental results representing the ratio of shift of the threshold voltage according to the energy (acceleration energy) determining an implanting depth of electrons. As shown in the above table, the threshold voltage is shifted rapidly when the energy is 8 kV or more, and the threshold voltage is stable when the energy is 7 kV and less.

Here, if the energy is too low, the implanting depth of electron is thin so that a bottom portion of the SOG film 4 is not cured sufficiently. Therefore, the appropriate energy of electron beam has to be selected to prevent a shift of the threshold voltage as well as to cure enough the SOG film.

Referring to the experimental results, when the energy is between 6 to 7 kV, the shift of threshold voltage can be minimized and the bottom portion of the SOG film is cured sufficiently. Also, electron does not implant into the silicon substrate. At this time, a does of electron is 3000 uC/cm² or more so that the is implanted sufficiently.

Figure 2A:
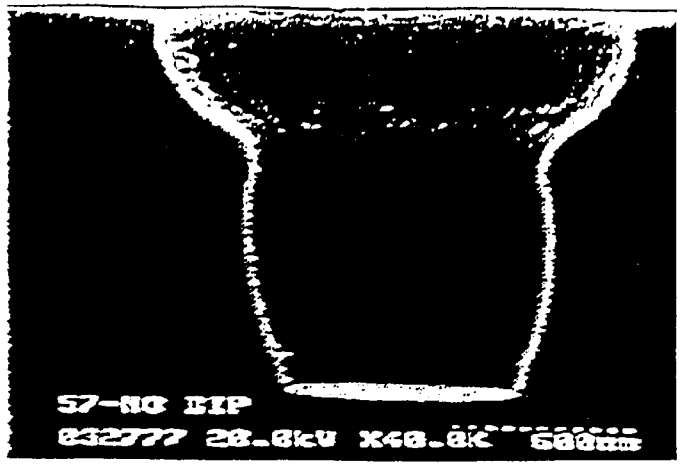
FIG. 2A to FIG. 2C ares photographs of section of a via hole showing SOG films cured in the furnace and by electron beam, respectively.
Figure 2B:
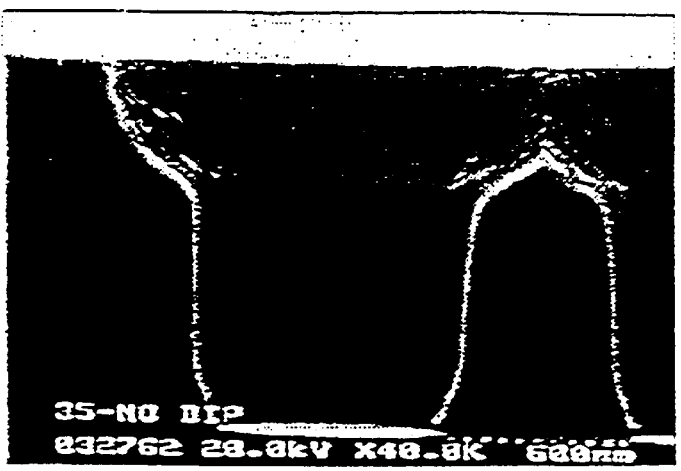
Figure 2C:

FIG. 2A to FIG. 2C are photographs showing the degrees of the shrinkage of the SOG films when SOG films are cured in the furnace and by the electron beam method, and are photographs of sections of via hole taken by SEM equipment after forming subsequently first insulating film of thickness of 1000 Angstrom, SOG film of thickness of 8500 Angstrom and a second insulating film of thickness 6000 Angstrom on a silicon substrate, and then forming a via hole.

FIG. 2A is a photograph showing a section of via hole after curing the SOG film in the furnace. FIG. 2A shows that side wall of the SOG film in the via hole is bowed due to a shrinkage of the SOG film.

FIG. 2B is a photograph showing a section of via hole after curing using an electron beam with an energy of 5 kV. FIG. 2B shows that side wall of bottom portion of the SOG film in the via hole is bowed due to a shrinkage of the SOG film.

FIG. 2C is a photograph showing a section of via hole after curing using an electron beam with an energy of 6 kV. FIG. 2C shows that side wall of the SOG film in the via hole is not bowed.

The results of FIG. 2A to FIG. 2C show that a bottom portion of the SOG film is cured sufficiently when a electron beam with energy of 6 kV is used for curing the SOG film.

As described above, the electron beam with energy of 6 to 7 kV and does of electron of 3000 uC/cm² or more is used for curing the SOG film so that the shift of threshold voltage can be prevented and moisture contained in the SOG film can be removed completely. Also, a bottom portion of the SOG film is cured sufficiently so that the bowing phenomenon of the SOG film in a via hole is not generated.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a spin on glass film of a semiconductor device, comprising the steps of:

forming an oxide film on a silicon substrate on which a metal wire is formed;

coating a spin on glass on said oxide film; and curing said spin on glass using an electron beam with a low energy of between 5 and 7 kV, thereby forming a spin on glass film.

2. The method of claim 1, wherein a dose of said electron is 3000 uC/cm$^2$ or more.

* * * * *